(12) United States Patent
Chuang et al.

(10) Patent No.: US 7,787,285 B2
(45) Date of Patent: Aug. 31, 2010

(54) INDEPENDENT-GATE CONTROLLED ASYMMETRICAL MEMORY CELL AND MEMORY USING THE CELL

(75) Inventors: Ching-Te Chuang, South Salem, NY (US); Jae-Joon Kim, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 12/140,366

(22) Filed: Jun. 17, 2008

(65) Prior Publication Data

US 2008/0278992 A1    Nov. 13, 2008

Related U.S. Application Data

(63) Continuation of application No. 11/362,612, filed on Feb. 27, 2006, now Pat. No. 7,417,889.

(51) Int. Cl.
*G11C 11/00* (2006.01)
(52) U.S. Cl. ........................ 365/154; 365/156; 365/226
(58) Field of Classification Search ................. 365/154, 365/156, 226
See application file for complete search history.

(56) References Cited

U.S. PATENT DOCUMENTS

| | | | |
|---|---|---|---|
| 5,673,230 A | 9/1997 | Kuriyama | ................... 365/203 |
| 5,986,924 A | 11/1999 | Yamada | |
| 6,198,656 B1 | 3/2001 | Zhang | ........................ 365/154 |
| 6,573,549 B1 | 6/2003 | Deng et al. | |
| 6,831,483 B2 * | 12/2004 | Shimazaki et al. | .......... 326/121 |
| 6,963,103 B2 * | 11/2005 | Forbes | ........................ 257/315 |
| 7,177,177 B2 * | 2/2007 | Chuang et al. | .............. 365/154 |
| 7,200,030 B2 * | 4/2007 | Yamaoka et al. | ............ 365/154 |
| 7,400,525 B1 * | 7/2008 | Kim | .......................... 365/156 |

OTHER PUBLICATIONS

Hodges & Jackson's textbook "Analysis and Design of Integrated Circuits," 2nd edition, at pp. 364-368 (New York, McGraw Hill, 1988).

Azizi et al., "Low-Leakage Asymmetric-Cell SRAM," IEEE Transactions on Very Large Scale Integration (VLSI) Systems, vol. 11, No. 4, pp. 701-715 (Aug. 2003).

(Continued)

*Primary Examiner*—Connie C Yoha
(74) *Attorney, Agent, or Firm*—Ryan, Mason & Lewis, LLP (57) ABSTRACT

Techniques are provided for employing independent gate control in asymmetrical memory cells. A memory circuit, such as an SRAM circuit, can include a number of bit line structures, a number of word line structures that intersect the bit line structures to form a number of cell locations, and a number of asymmetrical memory cells located at the cell locations. Each of the asymmetrical cells can be selectively coupled to a corresponding one of the bit line structures under control of a corresponding one of the word line structures. Each of the cells can include a number of field effect transistors (FETS), and at least one of the FETS can be configured with separately biased front and back gates. One gate can be biased separately from the other gate in a predetermined manner to enhance read stability of the asymmetrical cell.

20 Claims, 7 Drawing Sheets

OTHER PUBLICATIONS

Guo et al., "FinFEI-Based SRAM Design," ISLPED (Aug. 8-10, 2005).

Yamaoka et al., "Low Power SRAM Menu for SOC Application Using Yin-Yang-Feedback Memory Cell Technology," Symposium on VLSI Circuits Digest of Technical Papers, pp. 288-291 (2004).

Chuang et al., "Back-Gate Controlled Asymmetrical Memory Cell and Memory Using the Cell," U.S. Appl. No. 11/362,613, filed Feb. 27, 2006.

Chuang et al., "Asymmetrical Memory Cells and Memories Using the Cells," U.S. Appl. No. 11/392,071, filed Mar. 29, 2006.

Kuriyama et al, "An Asymmetric Memory Cell using a C-TFT for ULSO SRAMs," Symposium on VLSI Technology Digest of Technical Papers, pp. 38-39 (1992).

Itabashi et al , "A Split Wordline Cell for 16Mb SRAM Using Polysilicon Sidewall Contacts," IEEE, IEDM 91 (1991).

"Taurus-Medici: Industry-standard device simulation tool," Synopsys Data Sheet (2003).

Shang et al , "Mobility and CMOS Devices/Circuits on sub-10nm (110) Ultra Thin Body SOI," Symposium on VLSI Technology Digest of Technical Papers, pp. 78-79 (2005).

Kim et al., "Performance assessment of scaled strained-Si channel-on-insulator (SSOI) CMOS," Solid-State Electronics 48, pp. 239-243 (2004).

Takeda et al., "A Read-Static-Noise-Margin-Free SRAM Cell for Low-$V_{dd}$ and High-Speed Applications," IEEE International Solid-State Circuits Conference, pp. 478-479, 611 (2005).

* cited by examiner

FIG. 7

INDEPENDENT-GATE CONTROLLED ASYMMETRICAL MEMORY CELL AND MEMORY USING THE CELL

CROSS-REFERENCE TO RELATED APPLICATIONS

This application is a continuation, under 37 CFR 1.53(b), of co-assigned U.S. patent application Ser. No. 11/362,612 of inventors Chuang et al., now U.S. Pat. No. 7,417,889, and claims the benefit thereof, said application Ser. No. 11/362,612 having been filed on Feb. 27, 2006, and entitled "Independent-Gate Controlled Asymmetrical Memory Cell And Memory Using The Cell." The complete disclosure of the aforesaid application Ser. No. 11/362,612, now U.S. Pat. No. 7,417,889, is expressly incorporated herein by reference in its entirety for all purposes.

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention

FIELD OF THE INVENTION

The present invention generally relates to electronic circuitry and, more particularly, to electronic memory circuits.

BACKGROUND OF THE INVENTION

As device size substantially shrinks in advanced very large scale integration (VLSI) technology, increased process variation causes significant amounts of threshold voltage fluctuation. As a result, stability of static random access memory (SRAM) deteriorates due to large threshold voltage mismatches between two neighboring transistors in a cell. The well-known conventional six transistor SRAM is described, e.g., in Hodges & Jackson's textbook "Analysis and Design of Integrated Circuits," 2d edition, at pages 364-68 (New York, McGraw Hill, 1988). The conventional SRAM has its worst stability during the READ mode because the voltage at the storage node having a "zero" logic value rises during the READ cycle. If this increased node voltage is larger than the trip voltage of the inverter, the stored logic values will be flipped and data will be lost.

U.S. Pat. No. 6,198,656 to Zhang discloses an asymmetric memory cell for single-ended sensing. An apparatus including an asymmetrical memory cell having a first inverter and a second inverter is provided. The first inverter is larger than the second inverter.

U.S. Pat. No. 5,673,230 to Kuriyama discloses a semiconductor memory device capable of operating at high speed and stably even under low power supply voltage. A memory cell includes a read/write word line R/WL1 driving an access transistor Q1 in read and write operations and a write word line WL1 driving an access transistor Q2 in the write operation. In the write operation, both access transistors Q1 and Q2 are driven, and storage information is written in the memory cell by a bit line and a complementary bit line having potentials complementary to each other. On the other hand, in the read operation, only access transistor Q1 is rendered conductive, and storage information is read out through the bit line. Since access transistor Q2 is rendered nonconductive, a P type TFT transistor and an N type transistor operate as a complementary metal oxide semiconductor (CMOS) type inverter having a large voltage gain. Therefore, a sufficient operating margin is secured even in the read operation.

While the so-called asymmetrical SRAM cell can achieve an improved static noise margin (SNM) as compared to a conventional symmetrical SRAM cell, there are practical limits, due to device size considerations, to obtaining further improvement in the SNM.

It would be desirable to overcome the limitations in previous approaches.

SUMMARY OF THE INVENTION

Principles of the present invention provide techniques for independent-gate controlled asymmetrical SRAM cells and SRAMS using the cells. Cells according to the present invention can obtain improved read stability.

An exemplary embodiment of a memory circuit, according to one aspect of the present invention, includes a plurality of bit line structures, a plurality of word line structures, and a plurality of asymmetrical cells. The word line structures intersect the bit line structures to form a plurality of cell locations. The plurality of asymmetrical cells are located at the plurality of cell locations. Each of the cells is selectively coupled to a corresponding one of the bit line structures under control of a corresponding one of the word line structures. Each of the asymmetrical cells includes a plurality of field effect transistors (FETS). At least one of the FETS is configured with separately biased front and back gates. One gate is biased separately from the other gate in a predetermined manner to enhance read stability of the asymmetrical cell.

In one exemplary embodiment, the asymmetrical cells include a first inverter having first and second FETS and a second inverter having third and fourth FETS. The second inverter is crossed-coupled to the first inverter to form a storage flip-flop. The second FET is a metal oxide semiconductor FET (MOSFET) configured with the aforementioned separately front and back gates, and the front gate of the second FET is ground biased.

In another exemplary embodiment, otherwise similar to that just described, the first FET can also be configured with separately biased front and back gates, and the back gate of the first FET can be biased to a supply voltage.

In yet another exemplary embodiment, otherwise similar to the first embodiment described, the back gate of the second FET is ground biased.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
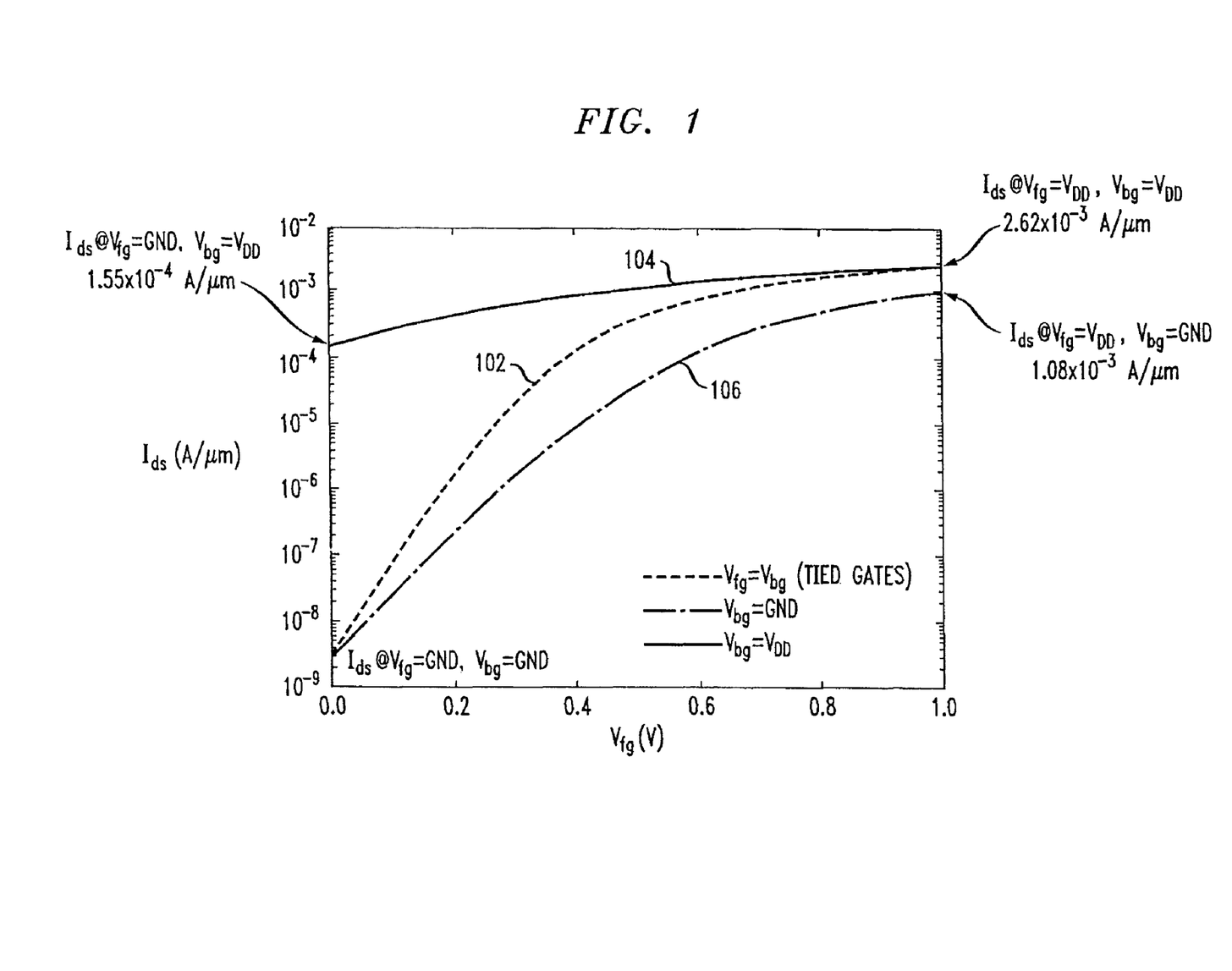
FIG. 1 depicts the drain-to-source current versus gate-to-source voltage characteristics of an asymmetrical double gate MOSFET with independent gate control, useful in one or more exemplary embodiments of the present invention.

It is useful to refer to FIG. 1 and to consider the drain-to-source current ($I_{ds}$) versus gate-to-source voltage ($V_{gs}$) characteristics of an asymmetrical double gate MOSFET with independent gate control. The $I_{ds}$ versus the front gate voltage ($V_{fg}$) characteristic is significantly different depending on the back gate voltage ($V_{bg}$). FIG. 1 depicts the $I_{ds}$-$V_{fg}$ curves 102, 104, 106 for, respectively the tied front and back gate, $V_{bg}$=$V_{DD}$, and $V_{bg}$=ground cases. In each case, the devices have the same effective channel length ($L_{eff}$=25 nm), identical front-gate and back-gate oxide thicknesses of 1 nm, and a film thickness of 7 nm. The body is undoped.

As shown in FIG. 1, we can have three different on-current values depending on the gate voltage setup. The case of the tied gates has the largest "on" current due to the coupling between the front and back gates. The case where the front gate is maintained at the supply voltage and the back gate is grounded has a larger current than the case where the front gate is grounded and the back gate is maintained at the supply voltage, since the threshold voltage of the front gate is lower than that of the back gate in this case. The transistor is off when both gates are grounded. The operating principles depicted in FIG. 1 are of use in employing independent gate control techniques, in addition to device sizing, to achieve an improved SNM in asymmetrical SRAMs.

Figure 2:
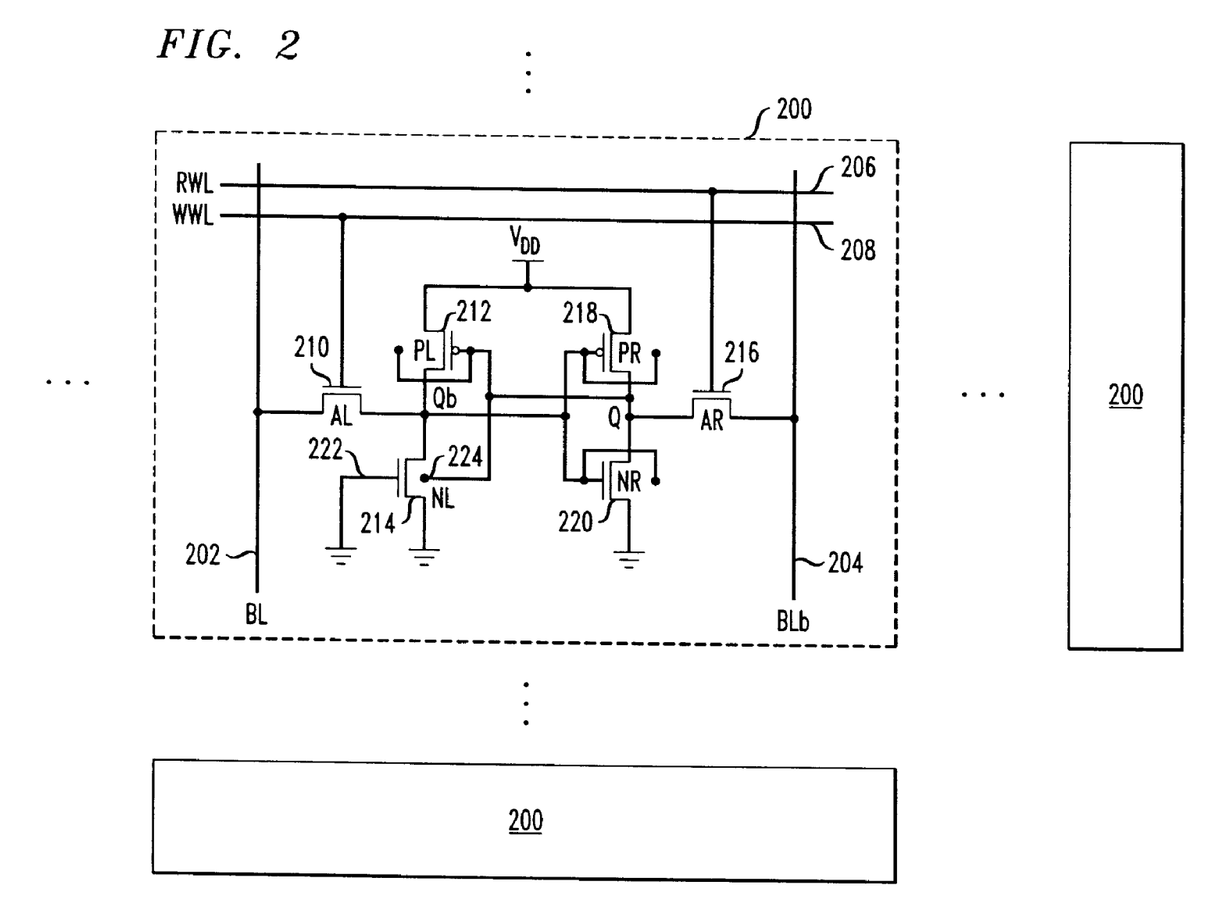
FIG. 2 shows an exemplary embodiment of a memory with an asymmetrical six transistor SRAM cell wherein the NL transistor has a ground-biased front gate, in accordance with one aspect of the present invention.

Attention should now be given to FIG. 2, which depicts a memory, such as an SRAM, employing asymmetrical SRAM cells in accordance with an exemplary embodiment of the present invention. It will be appreciated that asymmetrical cells 200 are part of the larger memory circuit having a plurality of bit line structures, such as those formed by true and complementary bit lines 202, 204. Further, the circuit also includes a plurality of word line structures, such as those formed by read and write word lines 206, 208 that intersect the plurality of bit line structures to form a plurality of cell locations. For illustrative convenience, only a single cell 200 is depicted in detail FIG. 2, the other cells being shown in block form. The skilled artisan will appreciate that a memory circuit can be provided, for example, in the form of an integrated circuit, having many such cells, as illustrated by the ellipses. In the exemplary embodiment, each of the cells 200 is asymmetrical, that is, the transistors AL, PL, NL, numbered 210, 212, 214 respectively are not identical to their counterparts PR, NR, AR, numbered 216, 218, 220 respectively. Stated differently, there is not symmetry between the left and right portions of the cell 200. Of course, a circuit could be provided with some cells of the type shown and some cells of a different type, either conventional or according to other embodiments of the present invention.

Each of the asymmetrical cells 200, located at one of the cell locations formed by the intersections of the bit line structures and the word line structures, is selectively coupled to a corresponding one of the bit line structures under control of a corresponding one of the word line structures. Each of the cells includes a plurality of field effect transistors (FETS). In accordance with techniques of the present invention, at least one of the FETS is configured with separately biased front and back gates. The front gate is biased separately from the back gate in a predetermined manner to enhance read stability of the asymmetrical cell. In the exemplary embodiment depicted in FIG. 2, the asymmetrical cell includes a first inverter formed by first and second FETS 212, 214, also designated as PL and NL. Furthermore, the cell includes a second inverter having third and fourth FETS 218, 220, also designated as PR and NR. The second inverter is cross coupled to the first inverter to form a storage flip-flop. In the exemplary embodiment depicted in FIG. 2, the second FET 214 is a MOSFET configured with separately biased front and back gates 222, 224. The front gate 222 of the FET 214 is grounded. As used herein, gates are separately or independently biased when they are not permanently tied together, such that they are capable of being maintained at different voltages In the exemplary embodiment depicted in FIG. 2, the first, third and fourth PETS 212, 218, 220 have their front and back gates tied together. Further, the front gate 222 of the second FET 214 can be formed, e.g., from n+ polysilicon and the back gate 224 of the second FET 214 can be formed, e.g., from p+ polysilicon. In more general terms, the electrode of the front gate can be formed from a material having a different work function than that of the material forming the electrode of the back gate. Thus, other approaches besides p+ and n− polysilicon could be used, e.g., front and back gates formed from two different metal gate materials. As noted, the bit line structures can be formed from the paired true and complementary bit lines 202, 204, and the word line structures can be formed from the paired read and write word lines 206, 208.

Fifth and sixth FETS 210, 216 can be provided and can be configured to effect the aforementioned selective coupling of the cells to the corresponding ones of the bit line structures under control of the corresponding ones of the word line structures. The second FET 214 can have a first drain-source terminal, labeled as node Qb and can be configured to have only a relatively small leakage when the back gate 224 of the second FET 214 is also ground-biased, such that a logical "one" value can be readily maintained at the first drain-source terminal labeled Qb. Furthermore, the first FET 212 can have a characteristic "off" current. As noted, the second FET can have a first drain-source terminal labeled as node Qb. Furthermore, the second FET 214 can be configured to have a relatively high "on" current, as compared to the "off" current of the first FET 212, when the back gate 224 of the second FET 214 is maintained at a supply voltage value, such a $V_{DD}$. Thus, a logical "zero" value can be readily maintained at the first drain-source terminal, labeled as node Qb.

By way of further detailed discussion pertaining to the exemplary embodiment in FIG. 2, it will be appreciated that a significant difference between the exemplary embodiment of FIG. 2 and an asymmetrical SRAM not using techniques of the present invention is the device configuration of the NMOS transistor (NL) in the inverter pair PL-NL. Let us assume for purposes of discussing FIG. 2 that a transistor has tied front-gate and back-gate unless stated otherwise. As shown in FIG. 2, the front-gate of NL is grounded so that only back-gate is used to control the conductivity of NL. If the back-gate voltage ($V_{bg}$) of NL is ground (GND), both gates are grounded so that NL has very small leakage. Hence, it can be used to hold a data "one" at node Qb. If $V_{bg}$ of NL is $V_{DD}$, the on-current ($I_{on}$) of NL is much higher than the off-current ($I_{off}$) of PL, and hence it can be used to hold data "zero" at the node Qb. Note that $I_{ds}$ @ $V_{fg}$=0V, $V_{bg}$=$V_{DD}$ is smaller than $I_{ds}$ @ $V_{fg}$=$V_{bg}$=$V_{DD}$ while it is much higher than $I_{ds}$ @ $V_{fg}$=$V_{bg}$=GND (FIG. 1). Hence, the trip voltage of the inverter PL-NL pair in FIG. 2 is higher than that of PL-NL pair in the scheme not employing inventive techniques. Even if noise voltage occurs at the node Q during a READ operation to disturb the back-gate of NL, the higher inverter trip voltage prevents data upset in the exemplary embodiment of FIG. 2.

Operating principles of the exemplary embodiment of FIG. 2 in READ and WRITE mode are the same as in asymmetrical SRAM cells not employing techniques of the present invention (with NL only under single gate control). In the READ operation, RWL=$V_{DD}$, WWL=ground During the WRITE operation, RWL=WWL=$V_{DD}$. In other words, the read word line RWL is "on" during both the WRITE and READ operations; it may thus be thought of as a "R/WWL" (read/write word line).

Figure 3:
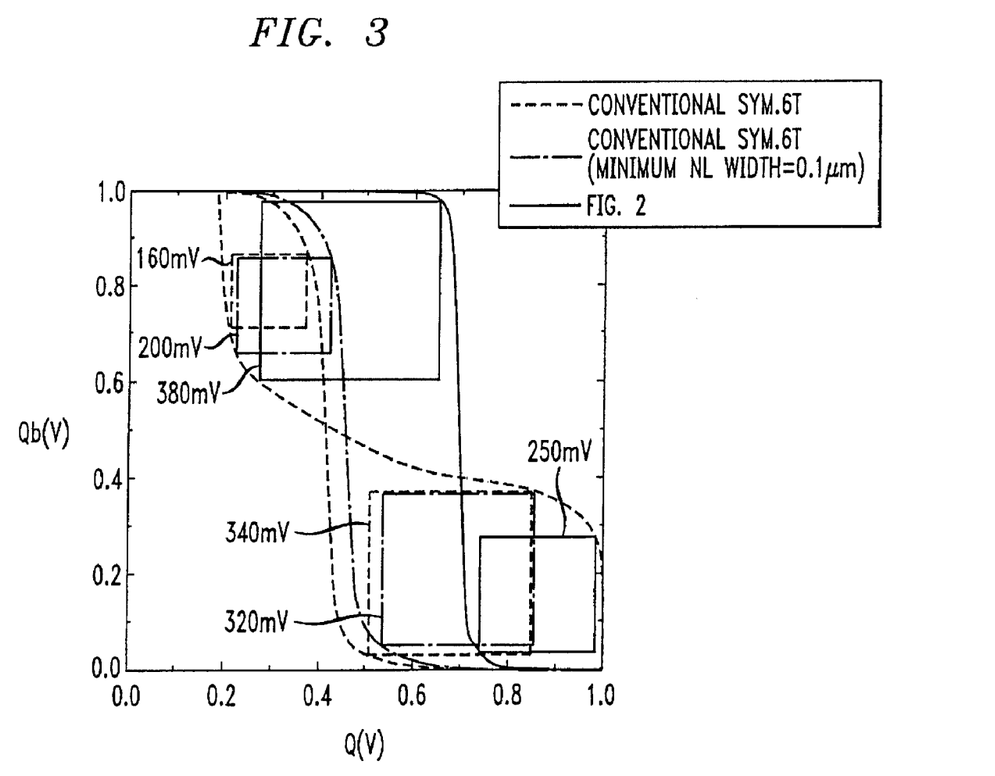
FIG. 3 shows a comparison of performance of the exemplary embodiment depicted in FIG. 2 with a symmetrical six transistor cell and an asymmetrical six transistor cell not employing techniques of the present invention.
Figure 4:
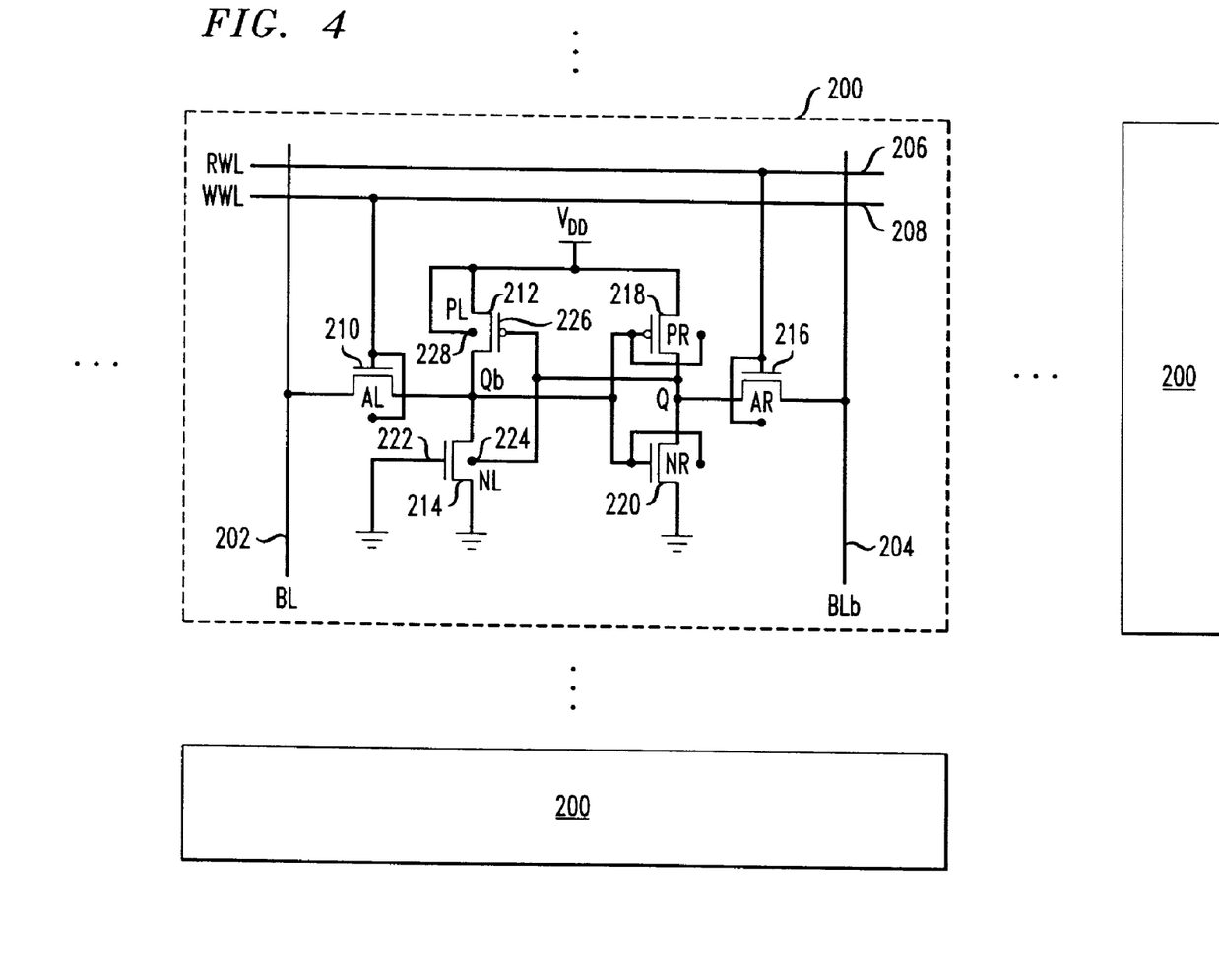
FIG. 4 depicts an exemplary embodiment of a memory with an asymmetrical six transistor SRAM cell using an NL transistor with a ground-biased front gate and a PL transistor with a supply voltage-biased back gate, according to another aspect of the present invention.

FIG. 3 shows the butterfly curve and SNM comparison for conventional single-ended READ symmetrical SRAM, asymmetrical SRAM with minimum NL width but not employing inventive techniques, and the exemplary embodiment of FIG. 2. We can observe that the exemplary embodiment of FIG. 2 has the largest SNM compared with the symmetrical 6T cell and asymmetrical 6T cell with minimum NL width. However, in spite of the improved SNM in the exemplary embodiment of FIG. 2, the observation that the Right SNM is larger than Left SNM in exemplary embodiment of FIG. 2 indicates that the strength of NL may become too weak under some circumstances, so that the trip voltage of the PL-NL pair may be unnecessarily high Attention should now be given to FIG. 4, wherein elements similar to those in FIG. 2 have received the same reference character. To reduce the trip voltage of the PL-NL pair, a modification can be made to the configuration depicted in FIG. 2. As shown in FIG. 4, all the elements are identical to those in FIG. 2 except the configuration for the device PL, numbered 212. In the configuration depicted in FIG. 4, the first FET 212, also labeled PL, is configured with separately biased front and back gates 226, 228 respectively. The back gate 228 of first FET 212 is biased to the supply voltage $V_{DD}$. Otherwise, the FETS 210, 216, 218, 220 are configured with their front and back gates tied together. True and complementary bit lines 206, 208 and fifth and sixth FETS 210, 216 can again be provided for access purposes as described with regard to FIG. 2. The modification to first FET 212 can result in it having a relatively lower "on" current as compared to an otherwise similar FET that did not have its back gate $V_{DD}$-biased. Thus, the first inverter formed by transistors 212, 214 can be configured with a lower trip voltage as compared to a similar inverter not having a first FET 212 with a relatively lower "on" current.

Thus, by way of summary and review, to reduce the trip voltage of the PL-NL pair, the exemplary embodiment shown in FIG. 4 can be adopted; the elements are similar to those in FIG. 2 except for the configuration of device PL. As noted, the back-gate of PL is tied to $V_{DD}$ so that the on-current of PL is reduced and the trip voltage of PL-NL becomes lower than in the FIG. 2 embodiment.

Figure 5:
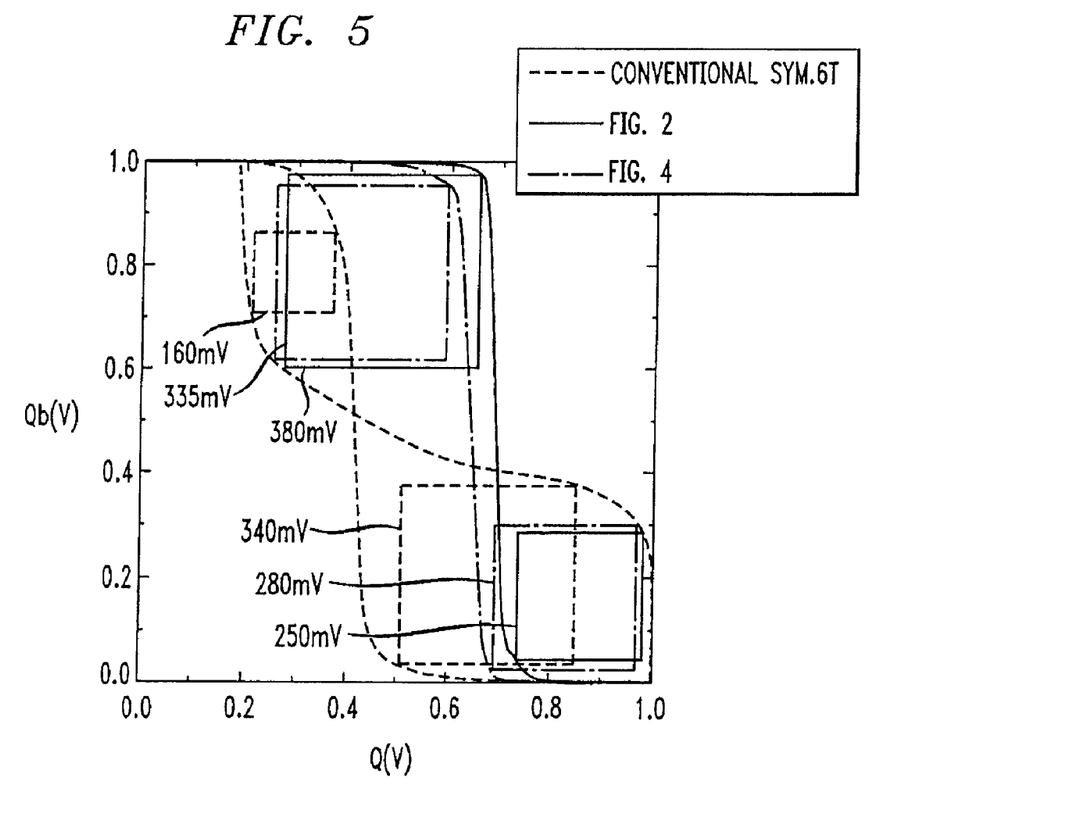
FIG. 5 depicts the performance of the exemplary embodiment shown in FIG. 4 compared to a symmetrical six transistor SRAM cell and the exemplary embodiment depicted in FIG. 2.

Turning now to FIG. 5, it can be seen that as a result of the techniques discussed in the preceding paragraph, the SNM of the exemplary embodiment of FIG. 4 is 30 mV higher than that of the exemplary embodiment of FIG. 2 due to the properly lowered trip-voltage of the PL-NL pair. However, despite the illustrated improvements, the Right SNM of the exemplary embodiment of FIG. 4 is still larger than the Left SNM, and hence there is room to further improve the SNM by further lowering the trip-voltage of the PL-NL pair.

Figure 6:
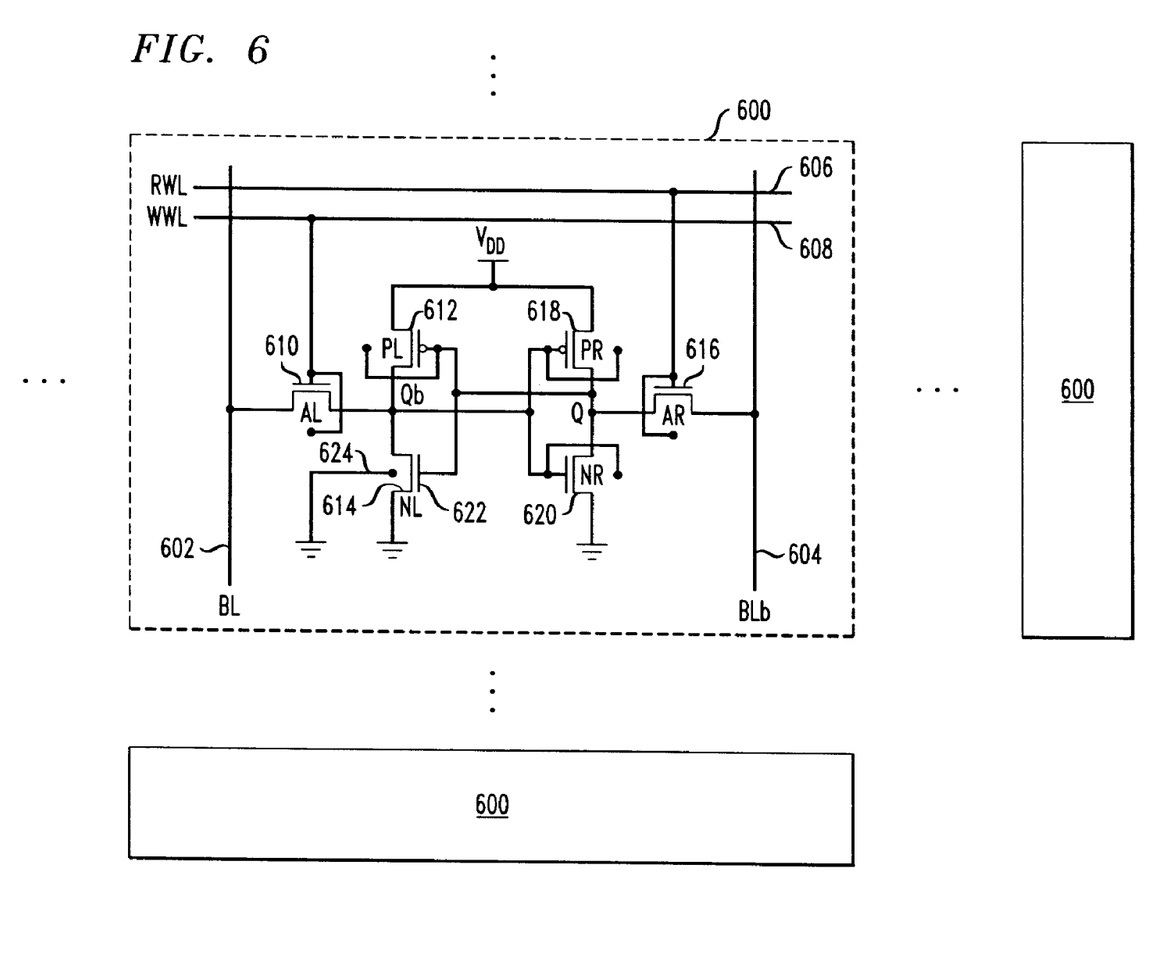
FIG. 6 shows an exemplary embodiment of a memory with a six transistor asymmetrical SRAM cell using an NL transistor with a ground-biased back gate, according to yet another aspect of the present invention.

Attention should now be given to FIG. 6, which depicts a memory cell 600 in a memory circuit. The comments about the circuit made with respect to FIG. 2 are equally applicable to FIGS. 4 and 6. Memory cell 600 is similar to cell 200 described with regard to FIG. 2, except that second transistor 614 is configured with a front gate 622 and a back gate 624, where the back gate 624 is ground-biased. This ground-bias of second transistor 614 can be use to enhance the SNM, particularly in conjunction with appropriate device sizing. Elements in FIG. 6 similar to those in FIG. 2 have received the same reference character incremented by 400 and will not be separately described. In the exemplary embodiment depicted in FIG. 6, the transistors other than second transistor 614 can have their front and back gates tied together. The bit line structures and word line structures can be identical to those described above, as can the access transistor 610, 616. The device widths of the first and second FETS 612, 614 can be preselected to obtain a desirable value of the SNM. In some configurations, the device widths could be substantially equal. In other configurations, the device width of the first FET could be narrower than (for example, about 40% of) the device width of the second FET. By way of example and not limitation, in the first (substantially equal) case, the device widths of the first and second FETS could each be about 0.1 μm. In the second (narrower) case, again by way of example and not limitation, the device width of the first FET could be about 0.1 μm and the device micron and the device width of the second FET could be about 0.25 μm.

Figure 7:
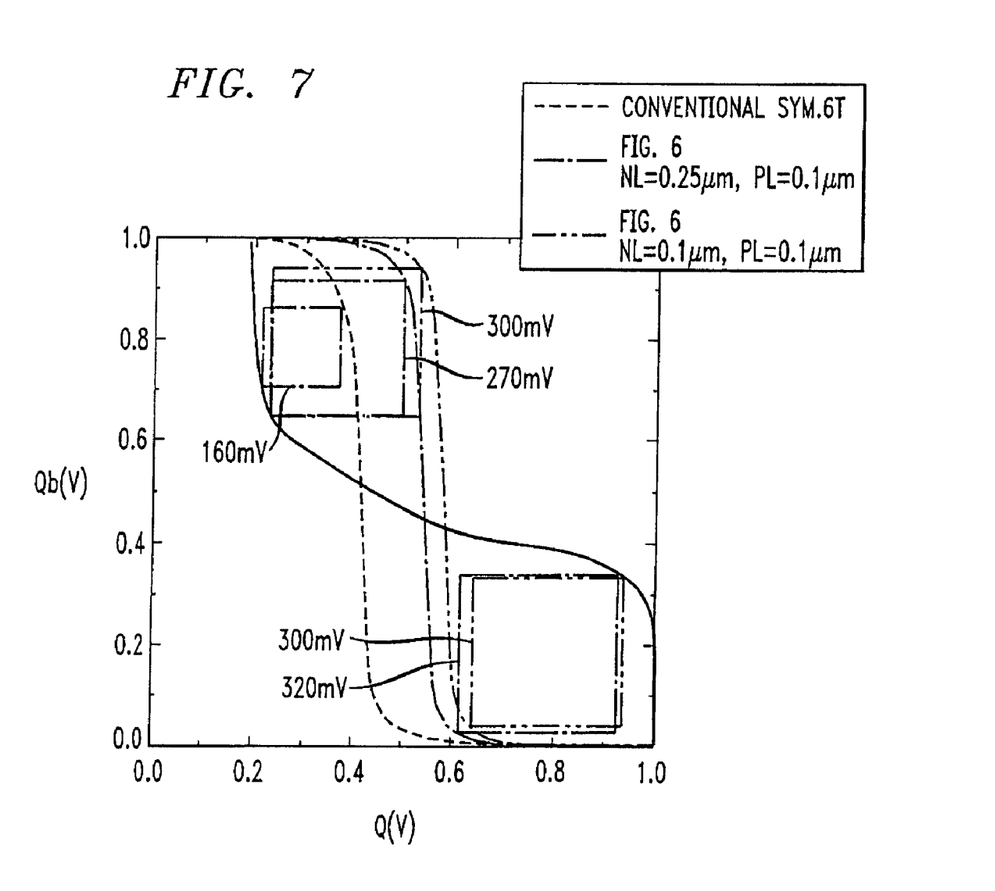
FIG. 7 depicts performance of the exemplary embodiment of FIG. 6 in a first case having NL width=0.25 μm and a second case having NL width=0.1 μm, in comparison to a symmetrical six transistor SRAM cell.

It will be appreciated that the values just given are exemplary, and the principle is to employ appropriate device sizing together with independent gate control to obtain to desirable value of SNM. Thus, the device width of the first FET can have a value other than substantially equal to, or 40% of, that of the second FET, depending on the particular facts and circumstances. FIG. 7 depicts a comparison of the SNM among a conventional single-ended six transistor cell, the scheme depicted in FIG. 6 with a 0.25 μm device width for NL, and the scheme depicted in FIG. 6 with a 0.1 μm device width for transistor NL. In the particular example shown, the best value of SNM, namely, 300 mV, is achieved by employing the configuration of FIG. 6 together with the minimum device width for transistor NL. In this particular case, the left and right values of SNM are identical.

It will be appreciated that one or more exemplary embodiments of the present invention may provide one or more advantages such as, for example, higher stability (e.g., READ stability) than certain other approaches that do not use techniques of the present invention.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network) If the designer does not fabricate chips or the photolithographic masks used to fabricate chips, the designer may transmit the resulting design by physical means (eg, by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A computer-readable medium encoding an apparatus, the encoded apparatus being a memory circuit, the encoded apparatus comprising:
    a plurality of bit line structures;
    a plurality of word line structures intersecting said plurality of bit line structures to form a plurality of cell locations, said plurality of word line structures comprising paired read and write word lines;
    a plurality of cells located at said plurality of cell locations, each of said cells being selectively coupled to a corresponding one of said bit line structures under control of a corresponding one of said word line structures, each of said cells in turn comprising:
        a first inverter having first and second field effect transistors (FETS); and
        a second inverter having third and fourth FETS, said second inverter being cross-coupled to said first inverter to form a storage flip-flop;
    wherein said second FET is a metal oxide semiconductor FET (MOSFET) configured with separately biased front and back gates, said front gate of said second FET being ground-biased, and wherein at least some of said cells are asymmetrically controlled by said paired read and write word lines.

2. The computer-readable medium as recited in claim 1, wherein said first, third, and fourth FETS are each configured with a front gate and a back gate tied to said front gate.

3. The computer-readable medium as recited in claim 2, wherein said front and back gates of said second FET each are formed of material, said material from which said front gate is formed having a different workfunction than that of said material from which said back gate is formed.

4. The computer-readable medium as recited in claim 3, wherein said front gate of said second FET is formed from n+ polysilicon and said back gate of said second FET is formed from p+ polysilicon.

5. The computer-readable medium as recited in claim 3, wherein said front gate of said second FET and said back gate of said second FET are formed from two different metal gate materials.

6. The computer-readable medium as recited in claim 3, wherein said bit line structures comprise paired true and complementary bit lines.

7. The computer-readable medium as recited in claim 6, wherein each of said cells further comprises fifth and sixth FETS configured to effect said selective coupling of said cells to said corresponding ones of said bit line structures under control of said corresponding ones of said word line structures.

8. The computer-readable medium as recited in claim 1, wherein said second FET has a first drain-source terminal and is configured to have only a relatively small leakage when said back gate of said second FET is also ground-biased, such that a logical "one" value can be readily maintained at said first drain-source terminal.

9. The computer-readable medium as recited in claim 1, wherein:
    said first FET has an "OFF" current; and
    said second FET has a first drain-source terminal and is configured to have a relatively high "ON" current, as compared to said "OFF" current of said first FET, when said back gate of said second FET is maintained at a $V_{DD}$ value, such that a logical "zero" value can be readily maintained at said first drain-source terminal.

10. The computer-readable medium as recited in claim 1, wherein:
    said first FET is configured with separately biased front and back gates, said back gate of said first FET being $V_{DD}$-biased; and
    said third and fourth FETS are each configured with a front gate and a back gate tied to said front gate.

11. The computer-readable medium as recited in claim 10, wherein:
    said bit line structures comprise paired true and complementary bit lines; and
    each of said cells further comprises fifth and sixth FETS configured to effect said selective coupling of said cells to said corresponding ones of said bit line structures under control of said corresponding ones of said word line structures.

12. The computer-readable medium as recited in claim 10, wherein said first FET has a relatively lower "ON" current as compared to a similar FET not having a $V_{DD}$-biased back gate.

13. The computer-readable medium as recited in claim 12, wherein said first inverter has a lower trip voltage as compared to a similar inverter not having a first FET with a relatively lower "ON" current.

14. A computer-readable medium encoding an apparatus, the encoded apparatus being a memory circuit, the encoded apparatus comprising:
   a plurality of bit line structures;
   a plurality of word line structures intersecting said plurality of bit line structures to form a plurality of cell locations, said plurality of word line structures comprising paired read and write word lines;
   a plurality of cells located at said plurality of cell locations, each of said cells being selectively coupled to a corresponding one of said bit line structures under control of a corresponding one of said word line structures, each of said cells in turn comprising:
      a first inverter having first and second field effect transistors (FETS); and
      a second inverter having third and fourth FETS, said second inverter being cross-coupled to said first inverter to form a storage flip-flop;
   wherein said second FET is configured with front and back gates, said back gate of said second FET being ground-biased, and wherein at least some of said cells are asymmetrically controlled by said paired read and write word lines.

15. The computer-readable medium as recited in claim 14, wherein said first, third, and fourth FETS are each configured with a front gate and a back gate tied to said front gate.

16. The computer-readable medium as recited in claim 15, wherein:
   said bit line structures comprise paired true and complementary bit lines; and
   each of said cells further comprises fifth and sixth FETS configured to effect said selective coupling of said cells to said corresponding ones of said bit line structures under control of said corresponding ones of said word line structures.

17. The computer-readable medium as recited in claim 14, wherein said first and second FETS each have a device width and where at least said device width of said second FET is preselected for a desirable value of static noise margin (SNM).

18. The computer-readable medium as recited in claim 17, wherein said device widths of said first FET and said second FET are substantially equal.

19. The computer-readable medium as recited in claim 17, wherein said device width of said first FET is narrower than that of said second FET.

20. A computer-readable medium encoding an apparatus, the encoded apparatus being a memory circuit, the encoded apparatus comprising:
   a plurality of bit line structures;
   a plurality of word line structures intersecting said plurality of bit line structures to form a plurality of cell locations, said plurality of word line structures comprising paired read and write word lines;
   a plurality of asymmetrical cells located at said plurality of cell locations, each of said asymmetrical cells being asymmetrically controlled by said paired read and write word lines and selectively coupled to a corresponding one of said bit line structures under control of a corresponding one of said word line structures, each of said asymmetrical cells in turn comprising a plurality of field effect transistors (FETS), at least one of said FETS being configured with separately biased front and back gates, one of said front and back gates being biased separately from another of said front and back gates in a predetermined manner to enhance read stability of said asymmetrical cell.

* * * * *